(12) United States Patent
Itoi

(10) Patent No.: US 7,102,654 B2
(45) Date of Patent: Sep. 5, 2006

(54) DRIVING CIRCUIT

(75) Inventor: Nobuo Itoi, Oizumi-machi (JP)

(73) Assignee: Sanyo Electric Co., Ltd., Osaka (JP)

( * ) Notice: Subject to any disclaimer, the term of this patent is extended or adjusted under 35 U.S.C. 154(b) by 284 days.

(21) Appl. No.: 10/318,411

(22) Filed: Dec. 13, 2002

(65) Prior Publication Data
US 2003/0122607 A1    Jul. 3, 2003

(30) Foreign Application Priority Data
Dec. 14, 2001   (JP) .............................. 2001-380793

(51) Int. Cl.
*G09G 5/10*       (2006.01)
(52) U.S. Cl. .......................... 345/691; 345/10; 345/11; 345/213
(58) Field of Classification Search ................ 345/204, 345/211–213, 10–14, 691; 348/500, 540; 315/169.1, 337, 370, 371, 368.17
See application file for complete search history.

(56) References Cited
U.S. PATENT DOCUMENTS

| | | | | |
|---|---|---|---|---|
| 4,503,456 A | * | 3/1985 | Nakamura et al. | 348/263 |
| 5,329,367 A | * | 7/1994 | Fernsler et al. | 348/540 |
| 5,519,445 A | * | 5/1996 | Ohira | 348/556 |
| 5,929,574 A | * | 7/1999 | Kim et al. | 315/370 |
| 6,404,135 B1 | * | 6/2002 | Shino | 315/169.1 |
| 6,549,198 B1 | * | 4/2003 | Uto et al. | 345/213 |
| 6,795,043 B1 | * | 9/2004 | Shibata | 345/13 |

* cited by examiner

*Primary Examiner*—Richard Hjerpe
*Assistant Examiner*—Jennifer T. Nguyen
(74) *Attorney, Agent, or Firm*—Morrison & Foerster LLP

(57) ABSTRACT

A driving circuit of this invention has a comparator that compares an input signal with a sampling signal to perform a pulse width modulation to the input signal, a driving transistor circuit that switches according to an output signal of the comparator, and a filter that reduces a switching frequency component of the driving transistor circuit. The switching frequency of the driving transistor circuit is a product of multiplication of a horizontal frequency. Also, a PLL circuit that locks the frequency of the sampling signal to the frequency acquired from multiplication of the horizontal frequency is provided. Therefore, when the driving circuit with the PWM method is built in a television set, beat interference can be prevented, avoiding an unpleasant view caused by the raster interference on the television screen.

7 Claims, 6 Drawing Sheets

Sampling Signal

PWM Siganl

DRIVING CIRCUIT

BACKGROUND OF THE INVENTION

1. Field of the Invention

This invention relates to a driving circuit utilized in a television receiver, especially to a driving circuit with a PWM (pulse width modulation) method, for example, a vertical deflection driving circuit, and a sound amplifying circuit using a PWM method.

2. Description of the Related Art

FIG. 5 is an outline of the vertical deflection driving circuit of the PWM method. A sawtooth wave voltage Vin for a vertical deflection is inputted to a positive input terminal (+) of a comparator 2 from an input terminal 1, and a sawtooth wave with frequency f is supplied to a negative input terminal (−) of the comparator 2 as a sampling signal (also known as a carrier signal).

As a result, a PWM signal with a pulse width corresponding to the level of the input sawtooth wave voltage Vin is acquired from the comparator 2 as seen from FIG. 6. The amplitude of the PWM signal is level-shifted by a level adjustment circuit 3 from Vcc1 (5V) to Vcc2, which is an enough voltage for driving output MOS transistors TR1 and TR2. Then, the level-shifted signal is supplied to a driving transistor circuit 4 comprising the output MOS transistors TR1 and TR2.

A pumping-up circuit 5 supplies a driving source voltage to the driving transistor circuit 4. The pumping-up circuit 5 turns on during a retracing period Tr and supplies the voltage of 2 Vcc to the driving transistor circuit 4. Since the transistor TR2 is off and the transistor TR1 is set to be on during the retracing period Tr, the output signal of the driving transistor circuit 4 is 2Vcc. On the other hand, a switching signal, on which a pulse width modulation has been performed, is outputted from the driving transistor circuit 4 during a scanning period Tt. Therefore, the waveform of the output signal from the driving transistor circuit 4 takes the shape shown in FIG. 7A.

Then, the output signal of the driving transistor circuit 4 is taken out from an output terminal 7 through a low pass filter 6. The output from the low pass filter 6 is supplied to a vertical deflection yoke coil not shown in the figure. The waveform of the output from the low pass filter 6 is shown in FIG. 7B. The PWM signal is reproduced as a waveform similar to the waveform of the inverted input sawtooth wave Vin when passing through the low pass filter 6.

With the vertical deflection driving circuit with the above-mentioned configuration or a sound amplifying circuit with the same configuration, it is necessary to reduce the switching frequency component fsw by the low pass filter 6 before inputting the switching frequency component fsw of the output MOS transistors TR1 and TR2 to the vertical deflection yoke coil or the speaker. This is because if the switching frequency component fsw is not reduced enough, a raster scan 50 of a television screen 100 shows wave-like distortions as seen from FIG. 8.

The peak of the wave in the raster scan 50 corresponds to the high output of the driving transistor 4 and the valley of the wave in the raster scan 50 corresponds to the low output of the driving transistor circuit 4. When the driving circuit with the PWM method is employed, the peak and valley of the wave in the raster scan 50 are gradually crumbled along with the change in the duty of the PWM signal. There are, for example, 525 raster scans on a television screen. Only a part of the raster scan is shown in FIG. 8.

In order to reduce the switching frequency component fsw, the ability of the low pass filter 6 may be enhanced. However, this may lead to the enlarged size of coil and capacitor as well as the high cost. Although the switching frequency may be ascended for the same purpose, there is a limit for this approach due to the characteristics of the output MOS transistors TR1, TR2 and other elements.

SUMMARY OF THE INVENTION

A driving circuit of this invention includes a comparator that compares an input signal with a sampling signal to perform a pulse width modulation to the input signal, a driving transistor circuit that switches according to an output signal of the comparator, and a filter that reduces the switching frequency component of the driving transistor circuit. The driving circuit supplies the output of the filter to a load, and the switching frequency fsw of the driving transistor circuit is the frequency of the television signal multiplied by an integer.

Therefore, the switching frequency component fsw is reduced to the extent that the disturbance of a raster scan in a television screen can be prevented.

Also, a PLL circuit that locks the switching frequency fsw of the driving transistor circuit to the frequency acquired from the multiplication of the horizontal frequency $f_H$ of the television signal is added to the above configuration.

The frequency difference $\Delta f$ between the fsw and the $n \cdot f_H$ is eliminated. Therefore, the beat interference noise caused by the frequency difference $\Delta f$ can be removed.

DESCRIPTION OF THE INVENTION

Figure 1:
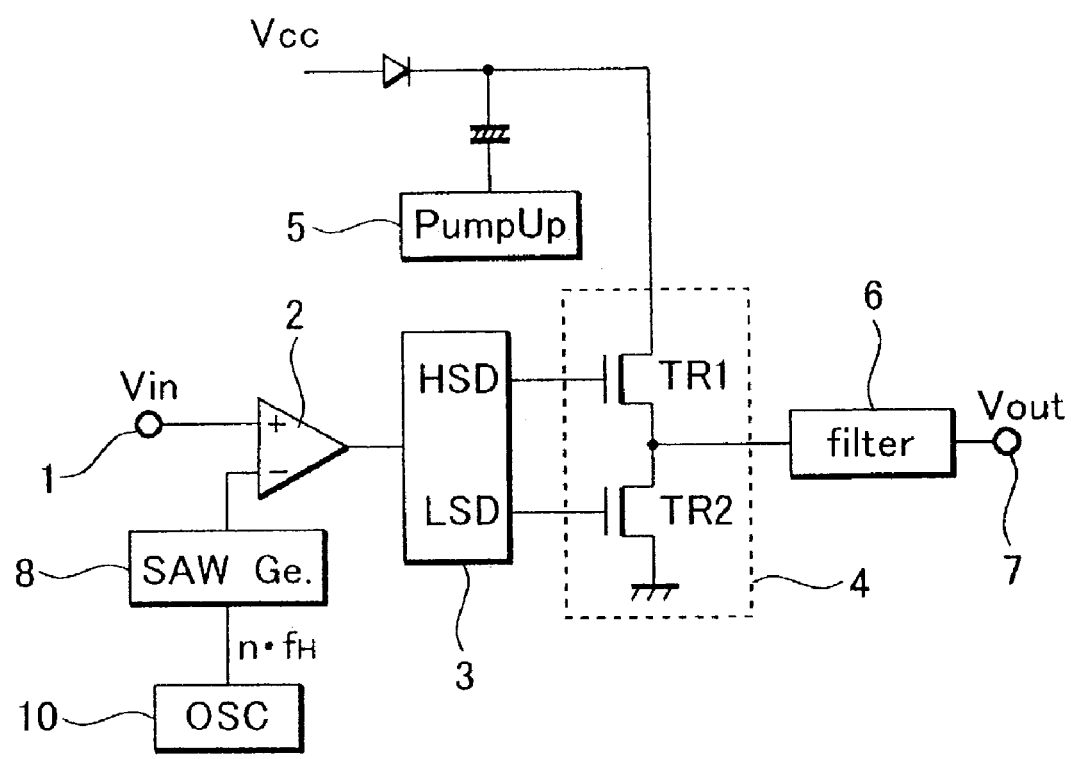
FIG. 1 is a circuit diagram of the vertical deflection driving circuit of a first embodiment of this invention.

The embodiments of this invention will be explained by referring to FIGS. 1–4B. FIG. 1 is an outline diagram of a vertical deflection driving circuit of a first embodiment of this invention. The same components as those in FIG. 5 are indicated by the same reference numerals, and the descriptions for these components are omitted.

According to the embodiment, a switching frequency fsw of transistors TR1 and TR2 of a driving transistor circuit 4 is set to be n-times (n is a natural number) of a horizontal frequency $f_H$ of a television signal. Since the transistors TR1 and TR2 switch according to a PWM signal with a pulse width modulation performed by a comparator 2, the switching frequency fsw is equal to the frequency of a sampling signal inputted into the comparator 2.

The frequency of the sampling signal is set to be n-times of the horizontal frequency $f_H$. An oscillator 10 that oscillates with $n \cdot f_H$ can generate this sort of sampling signal. The oscillator can be designed to oscillate with $2n \cdot f_H$ or $4n \cdot f_H$ and so on. An oscillator output signal of the oscillator 10 is supplied to a sawtooth wave generating circuit 8. The sawtooth wave generating circuit 8 produces the sampling signal from the oscillator output signal and supplies the signal to the comparator 2. In case of an NTSC signal, the horizontal frequency $f_H$ is 15.7 Hz. When the frequency of the sampling signal is set to fourfold of the horizontal frequency $f_H$, a coil of the filter 6 should be larger in size because the frequency is low. On the other hand, when the frequency of the sampling signal is set to sixteenfold of the horizontal frequency $f_H$, the transistor TR1 and TR2 cannot switch according to such a high frequency. Therefore, it is preferable to set the frequency of the sampling signal to 125.6 Hz, which is eightfold of the horizontal frequency $f_H$.

However, the oscillation frequency of the oscillator 10 has a variation among devices and a temperature dependence. The variation among devices can be adjusted by adjusting the value of an external resistor or capacitor. However, it is difficult to make an adjustment for the temperature dependence.

Therefore, if an independent oscillator 10 is used, the frequency difference $\Delta f$ (f sw–8 $f_H$) will take place, leading to a beat interference, which causes wave-like distortion in a raster scan in a television screen, making the television screen unpleasant view to the television viewers.

Figure 2:
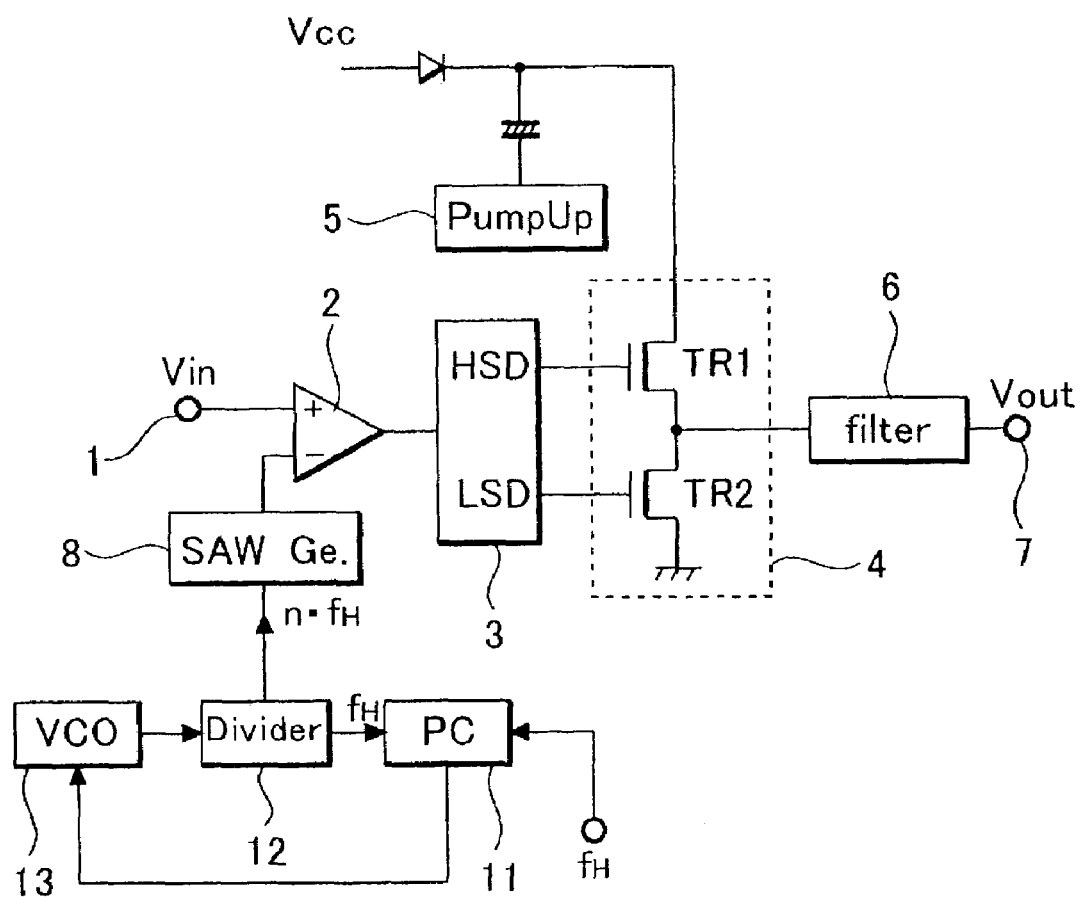
FIG. 2 is a circuit diagram of the vertical deflection driving circuit of a second embodiment of this invention.

In a second embodiment of this invention, a PLL circuit that locks the frequency of the sampling signal to the frequency eightfold of the horizontal frequency $f_H$ is provided as seen from FIG. 2. The reference numeral 11 indicates a phase comparator that compares a horizontal output signal of the frequency $f_H$ and a divider output signal of the frequency $f_H$ from a divider 12. And the result of the comparison is applied to a voltage-controlled oscillator 13.

The voltage-controlled oscillator 13 oscillates with frequency of 16 $f_H$, and the oscillation output is applied to the divider 12. This completes a phase lock loop. The divider 12 supplies the oscillation output signal of 8 $f_H$, which is a half of the oscillation signal of the voltage controlled oscillator 13, to the sawtooth wave generating circuit 8. The sawtooth wave generating circuit 8 generates the sampling signal from the oscillation output signal of 8 $f_H$, and supplies the signal to the comparator 2.

Figure 8:
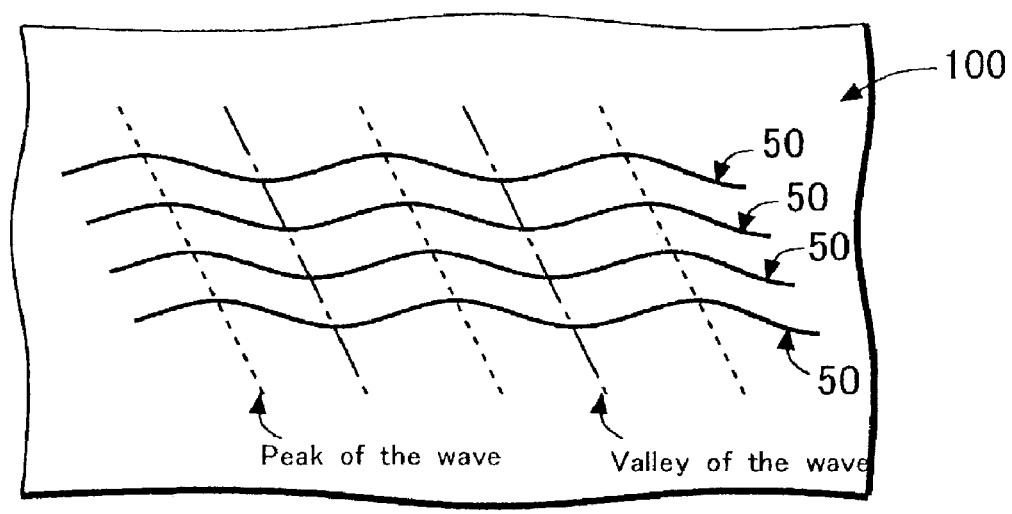
FIG. 8 shows a conventional television screen with raster scan having a wave-like distortion.

Therefore, the frequency difference $\Delta f$ (f sw–8 $f_H$) is substantially zero, preventing the beat interference caused by the frequency difference $\Delta f$ (f sw–8 $f_H$). The switching frequency f sw component of the driving transistors TR1 and TR2 cannot be removed completely through the low pass filter 6. The remaining switching frequency f sw component causes the raster scan 50 shown in FIG. 8. However, the PLL circuit prevents the movement of the raster scan 50, making it practically invisible.

Figure 3:
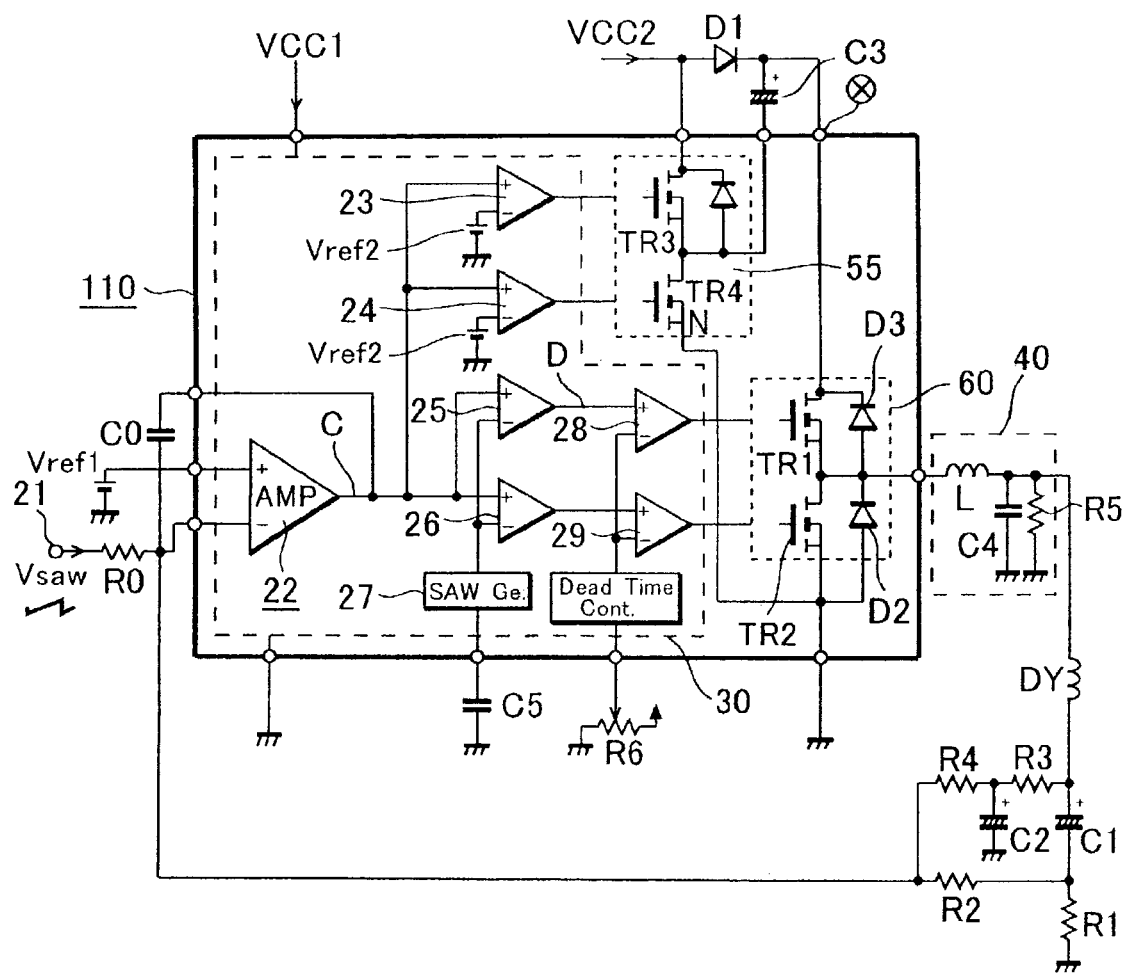
FIG. 3 is a detailed circuit diagram of the vertical deflection driving circuit of FIG. 1.

Next, a mode for carrying out the invention will be described referring to FIGS. 1–4B. A circuit diagram of a vertical deflection driving circuit with the PWM method according to the invention is shown in FIG. 3. The portion surrounded by the thick line shows components built in a semiconductor integrated circuit 110. Other components are external to the integrated circuit 110.

Sawtooth voltage Vsaw for vertical deflection applied to an input terminal 21 is supplied to a negative terminal (−) of a differential amplifier circuit 22 (pre-amplifier) through a resistor R0. Reference voltage Vref1 is supplied to positive terminal (+) of the differential amplifier circuit 22. Output of the differential amplifier circuit 22 is fed back to the negative-input terminal (−) through a capacitor C0. Output of the differential amplifier circuit 22 is supplied to negative-input terminals (−) of comparators 23 and 24 (second comparator) for pumping-up.

Figure 4A:
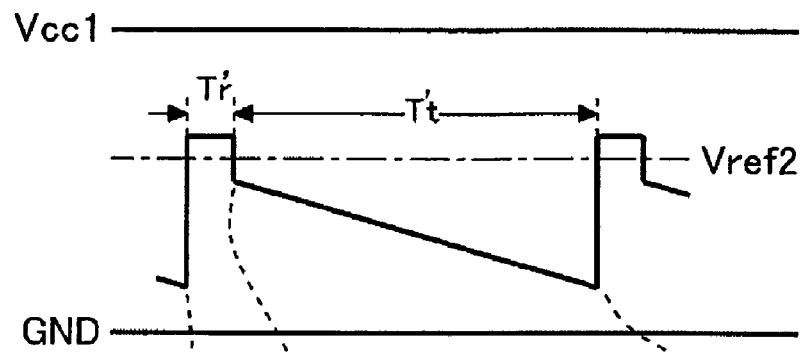
FIG. 4A is an output waveform of a differential amplifier of FIG. 3.
Figure 4B:
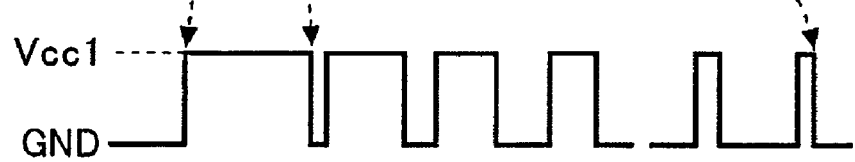
FIG. 4B is an output waveform of the comparators of FIG. 3.
Figure 5:
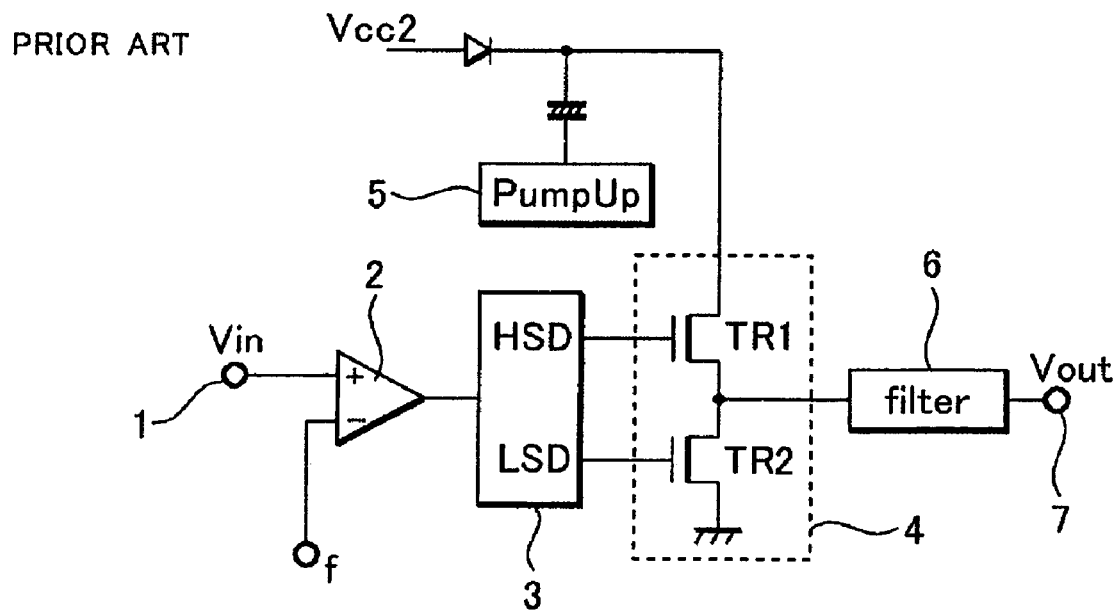
FIG. 5 is a circuit diagram of a vertical deflection driving circuit with PWM.
Figure 6A:
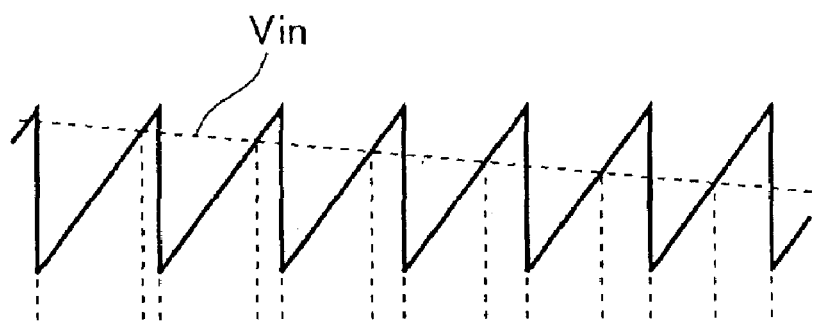
FIG. 6 is an operation waveform of the vertical deflection driving circuit of FIG. 5.
Figure 6B:
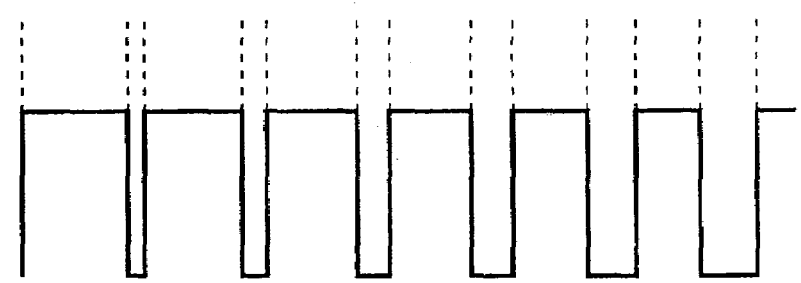
Figure 7A:
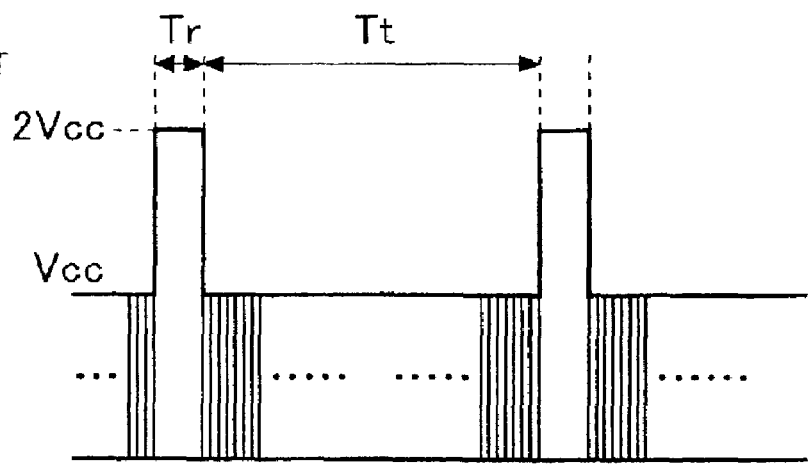
FIG. 7A is an output waveform of a driving transistor circuit of FIG. 5.
Figure 7B:
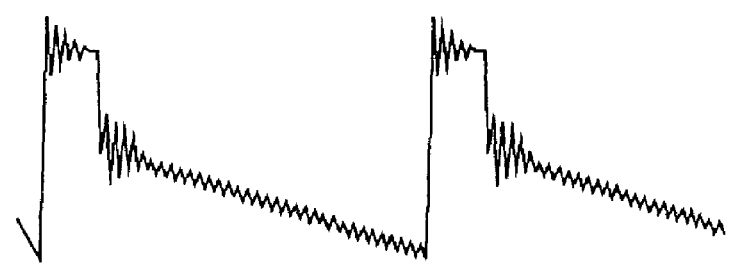
FIG. 7B is an output waveform of a low pass filter of FIG. 5.

Output waveform (voltage waveform at point C in the figure) of the differential amplifier circuit 22 is shown in FIG. 4 A. That is, output of the differential amplifier circuit 22 is higher at a retracing period Tr' than at a scanning period Tt'. Therefore, by setting reference voltage Vref2 supplied to positive input terminal (+) of the comparators 23 and 24 for pumping-up to a level identifying the retracing period Tr' as FIG. 4A, it is possible to detect retracing period Tr'.

The two comparators 23 and 24 for pumping-up are provided in order to correspond to MOS transistors TR3 and TR4 for pumping-up switching described later.

Outputs of the comparators 23 and 24 for pumping-up are supplied to a pumping-up switching circuit 55. The pumping-up switching circuit 55 includes a level shift circuit (not shown) boosting output voltage level of the comparators 23 and 24 for pumping-up, and the level-shifted voltage is supplied to gates of the MOS transistors TR3 and TR4 for pumping-up switching.

The MOS transistors TR3 and TR4 for pumping-up switching are connected between power source voltage Vcc2 (25 V for example) and ground voltage (0 V). Thus, TR3 is on and TR4 is off during the retracing period Tr', and during the scanning period Tt', TR 3 is off and TR 4 is on.

In this embodiment, TR3 is P channel type and TR4 is N channel type. However, both of TR3 and TR4 may be N channel types. In this case, a level adjustment circuit 3, that includes a HSD (high-side driver) for driving a high-side TR3 and a LSA (low-side driver) for driving a low-side TR4, as shown in FIGS. 1 and 2, is required.

As TR3 and TR4 function as switches, they may be constructed with bipolar transistors.

Thus, the terminal X of the capacitor C3 is charged to power source voltage Vcc2 through the diode D1 during the scanning period Tt' in the pumping-up circuit that includes the capacitor C3 for pumping-up and the diode D1. On the other hand, the terminal X of the capacitor C3 for pumping-up becomes 2 Vcc2 by capacitor coupling effect during the retracing period Tr'. The capacitor C3 and the diode D1 are external to the integrated circuit 110.

Output of the differential amplifier circuit 22 is inputted to positive input terminals (+) of comparators 25 and 26 (first comparator). To negative-input (−) of the comparators 25 and 26, output of a sawtooth wave generating circuit 27 is supplied as the sampling signal (a carrier signal).

The saw wave generating circuit 27 of this embodiment corresponds to the saw wave generating circuit 8 of FIG. 1. The oscillation frequency is set to be n-times, preferably eightfold, of the horizontal frequency $f_H$. Also, the saw wave generating circuit 27 can be replaced with the PLL circuit of FIG. 2. As mentioned above, this eliminates the frequency difference $\Delta f$ (f sw–8 $f_H$), and thus avoids the beat interference caused by the frequency difference $\Delta f$ (f sw–8 $f_H$).

Thus, the comparators 25 and 26 carry out pulse width modulation to output signal of the differential amplifier circuit 22 as shown in FIG. 4 B. The two comparators 25 and 26 are provided in order to correspond with MOS transistors TR1 and TR2 for driving described later.

Output pulses of the comparators 25 and 26 are supplied to comparators 28 and 29 of the next stage. A dead time control circuit 30 supplies a reference voltage for dead time control to the comparators 28 and 29.

Outputs of the comparators 28 and 29 are supplied to an output circuit 60. The output circuit 60 includes a level shift circuit (not shown) boosting output voltage level of the comparators 28 and 29, and the level-shifted voltage is supplied to gates of MOS transistors TR1 and TR2 for driving. The MOS transistors TR1 and TR2 for driving are connected between power source voltage Vcc2 (25 V for example) and ground voltage (0 V).

Here, although TR1 is P channel type and TR2 is N channel type, both may be constructed with bipolar transistors. It is also possible for the both transistors TR1 and TR2 to be N-channel type.

Although the output circuit 60 that includes the MOS transistors TR1 and TR2 for driving outputs pulse waveform similar as output waveform of the comparators 28 and 29, the voltage amplitude is level-inverted to power source voltage Vcc2 (25 V) from power source voltage Vcc1 (5 V).

Then, output of the output circuit 60 is supplied to a vertical deflection yoke coil DY through a filter circuit 40 (low pass filter) that includes a coil 4, a capacitor C4, and a resistor R5 so that vertical deflection driving is carried out.

Although counter-electromotive power is generated by the vertical deflection yoke coil DY in the vertical deflection driving circuit of PWM method, the counter-electromotive power is absorbed to a ground line (GND line) as follows: First, as to the counter-electromotive voltage Vb of ground side, a diode D2 connected between source and drain of the MOS transistor TR2 for driving operates so that the voltage Vb is absorbed (cramped) to the ground line.

Second, because the MOS transistor TR4 for pumping-up switching is on during the scanning period Tt', current flows through a channel so that counter-electromotive voltage Va of power source side is absorbed (cramped), i.e., the diode D3 connected between source and drain of the MOS transistor TR1 for driving, the capacitor C3 for pumping-up, TR4, and the ground line (GND line).

On the other hand, detecting retracing period Tr' using counter-electromotive voltage Va becomes impossible because the counter-electromotive voltage Va of power source side is absorbed and removed. However, this doe not pose any problem because it is possible to detect the retracing period Tr' and to operate the pumping-up circuit based on the detection of the retracing period Tr' using the comparators 23 and 24 for pumping-up, as described above.

In the embodiments described above, the vertical deflection driving circuit with the PWM method is used as an example, but this invention is also applicable to a sound amplifying circuit with the similar PWM method built in the television receiver. That is, a sound signal is inputted from the positive input terminal (+) of the comparator 2 and the n $f_H$ (preferably the sampling signal with the frequency of 8 $f_H$) is inputted from the negative input terminal (−) of the comparator 2 shown in FIG. 1.

Also, the PLL circuit is preferably provided in order to lock the frequency of the sampling signal to eightfold of the horizontal frequency $f_H$. The leak of the switching frequency fsw from the sound amplifying circuit with the PWM method is prevented by this, avoiding the appearance of the interference of the raster scan on the television screen.

What is claimed is:

1. A driving circuit comprising:
   a pre-amplifier circuit receiving a sawtooth wave voltage for a vertical deflection;
   a comparator comparing an output signal of the pre-amplifier circuit with a sampling signal and performing a pulse width modulation to the output signal of the pre-amplifier circuit;
   a driving transistor circuit that switches according to an output signal of the comparator, a switching frequency of the driving transistor circuit being a frequency of a television signal multiplied by an integer,
   a pumping-up circuit raising a source voltage supplied to the driving transistor circuit during a retracing period; and
   a filter reducing a component of the switching frequency of an output of the driving transistor circuit, an output of the filter being supplied to a vertical deflection yoke.

2. The driving circuit of claim 1, further comprising a PLL circuit locking the switching frequency of the driving transistor circuit to the frequency of a television signal multiplied by an integer.

3. The driving circuit of claim 2, wherein the integer for multiplying the television signal frequency is 8.

4. The driving circuit of claim 1, wherein the driving transistor circuit comprises a pair of MOS transistors.

5. The driving circuit of claim 2, wherein the driving transistor circuit comprises a pair of MOS transistors.

6. The driving circuit of claim 3, wherein the driving transistor circuit comprises a pair of MOS transistors.

7. The driving circuit of claim 1, wherein the pre-amplifier circuit comprises an input terminal configured to receive the output signal of the pre-amplifier circuit as a feedback signal.

* * * * *